(12) United States Patent
Yoon

(10) Patent No.: US 8,619,479 B2
(45) Date of Patent: Dec. 31, 2013

(54) METHOD FOR SYNCHRONIZING SIGNALS AND PROCESSING DATA

(75) Inventor: Sang Sic Yoon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 180 days.

(21) Appl. No.: 13/219,625

(22) Filed: Aug. 27, 2011

(65) Prior Publication Data

US 2012/0120744 A1      May 17, 2012

(30) Foreign Application Priority Data

Nov. 16, 2010 (KR) .................. 10-2010-0113784

(51) Int. Cl.
*G11C 7/00* (2006.01)

(52) U.S. Cl.
USPC ........................................ 365/193; 365/233.1

(58) Field of Classification Search
USPC .............................................. 365/193, 233.1
See application file for complete search history.

(56) References Cited

U.S. PATENT DOCUMENTS

| | | | | |
|---|---|---|---|---|
| 6,061,292 | A * | 5/2000 | Su et al. | 365/230.06 |
| 6,680,869 | B2 * | 1/2004 | Sonoda et al. | 365/189.05 |
| 7,372,745 | B2 * | 5/2008 | Kitamura | 365/189.05 |

* cited by examiner

*Primary Examiner* — Son Dinh
(74) *Attorney, Agent, or Firm* — William Park & Associates Patent Ltd.

(57) ABSTRACT

A method for synchronizing signals includes the steps of receiving a preamble of a data strobe signal in response to a write preamble command, and synchronizing the data strobe signal with a clock signal through the preamble of the data strobe signal.

5 Claims, 2 Drawing Sheets

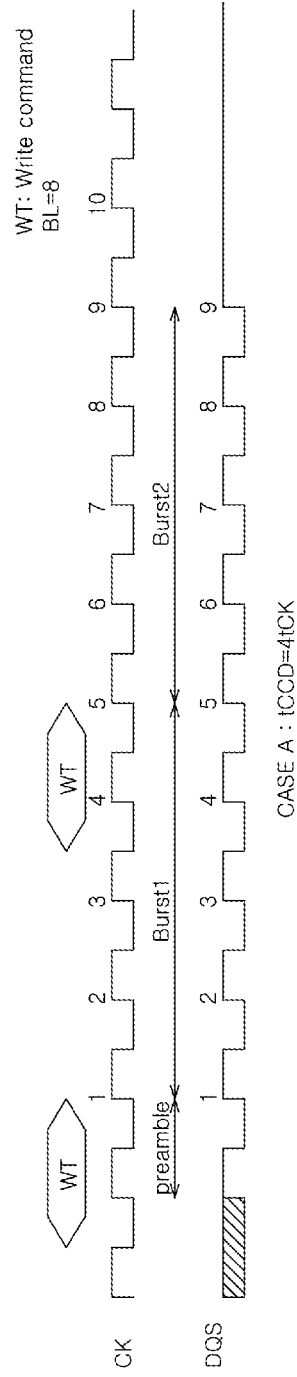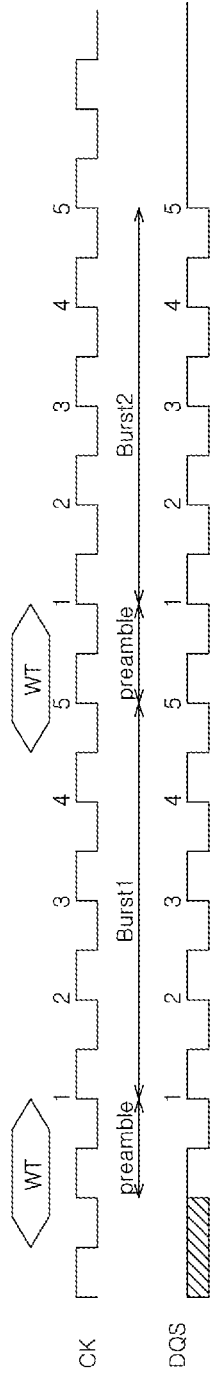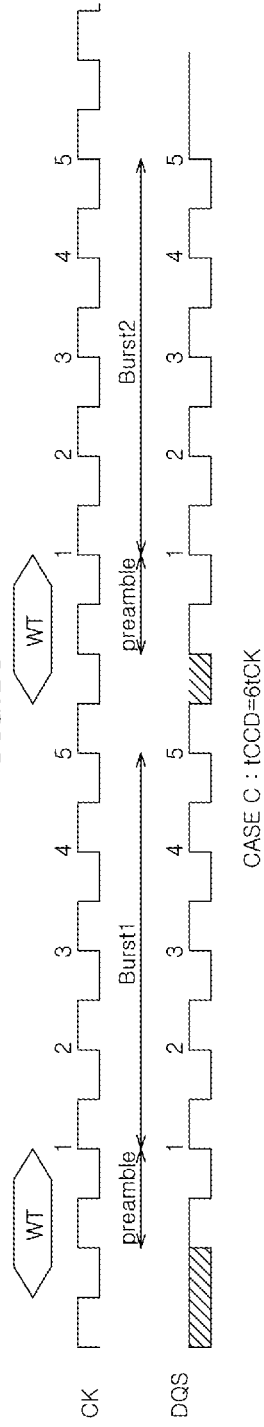

CASE A : tCCD=4tCK

CASE B : tCCD=5tCK

CASE C : tCCD=6tCK

METHOD FOR SYNCHRONIZING SIGNALS AND PROCESSING DATA

CROSS-REFERENCES TO RELATED APPLICATION

The present application claims priority under 35 U.S.C. §119(a) to Korean application number 10-2010-0113784, filed on Dec. 16, 2010, in the Korean Intellectual Property Office, which is incorporated herein by reference in its entirety.

BACKGROUND

1. Technical Field

The present invention relates generally to a semiconductor memory and more particularly to a technology for synchronizing timing of a data strobe signal with timing of a clock signal.

2. Related Art

The degree of high integration and the operating speeds of the semiconductor apparatuses, integrated circuits, etc. have continuously improved over time. The semiconductor apparatuses and the integrated circuits operate in synchronization with a periodic pulse signal such as a clock to increase the operational speed and allow efficient internal operations. Most semiconductor apparatuses and integrated circuits operate using an external clock and/or a self-generated internal clock.

In a semiconductor memory apparatus, data are inputted in synchronization with a data strobe signal DQS, and a command signal is inputted in synchronization with a clock signal CLK. When operating a high speed data input/output operations, the timing margin between two DQS and CLK signals is reduced, and it may lead to problems in the data input/output operations, which will be described in more detail with respect to FIGS. 1A-1C.

FIG. 1A-1C are timing diagrams related to an operation when a 'tccd' (for example, an internal burst length) is a 4tck (CASE A), 5tck (CASE B), and 6tck (CASE C), respectively.

In the CASE A, (1) the pattern of a preamble of a data strobe signal DQS is recognized, (2) the position of the preamble of the data strobe signal DQS is determined, and (3) a clock signal CLK and the data strobe signal DQS are synchronized to each other. The data then can be inputted for storage in an internal memory block, in response to first and second write commands WT and in synchronization with the data strobe signal DQS, which is internally synchronized with the clock signal CLK.

In the CASE B and CASE C, (1) the pattern of a preamble of a first data strobe signal DQS is recognized, (2) the position of the data strobe signal DQS is determined, and (3) a clock signal CLK and the data strobe signal DQS are synchronized to each other. Data, which is inputted in response to a first write command WT, is processed by the internally synchronized clock signal CLK and the data strobe signal DQS, and is stored in the internal memory block. The pattern of a preamble of a second data strobe signal DQS is recognized, the position of the preamble of the data strobe signal DQS is determined, and the clock signal CLK and the data strobe signal DQS are resynchronized with each other. Data, which is inputted in response to a second write command WT, is processed by the internally resynchronized clock signal CLK and data strobe signal DQS, and is stored in the internal memory block.

As described above, in order to synchronize the clock signal CLK and the data strobe signal DQS, the general semiconductor memory apparatus promises the position of the preamble of the data strobe signal and adjusts the width of the preamble. However, in order to perform the above-mentioned operation, it is necessary for the semiconductor memory apparatus to include an additional preamble detection circuit for detecting position information of the preamble.

SUMMARY

A signal synchronization method capable of synchronizing a data strobe signal with a clock signal through a write preamble command is described herein.

A data processing method capable of processing data using synchronized clock signal CLK and data strobe signal DQS is described herein.

In an embodiment of the present invention, a method for synchronizing signals includes the steps of: receiving a preamble of a data strobe signal in response to a write preamble command; and synchronizing the data strobe signal with a clock signal through the preamble of the data strobe signal.

In an embodiment of the present invention, a method for processing data, which is input in synchronization with a data strobe signal, includes the steps of: receiving a preamble of the data strobe signal in response to a write preamble command; synchronizing timing of the data strobe signal with timing of a clock signal through the preamble of the data strobe signal; and processing data, which is input in synchronization with the data strobe signal, under a control of the data strobe signal and the clock signal.

In an embodiment of the present invention, a method for processing data, which is input in synchronization with a data strobe signal, includes the steps of: receiving a preamble of the data strobe signal in response to a first write preamble command; synchronizing timing of the data strobe signal with timing of a clock signal through the preamble of the data strobe signal; processing first data, which is input in synchronization with the data strobe signal, under a control of the data strobe signal and the clock signal; processing second data, which is input in response to a first write command, under the control of the data strobe signal and the clock signal; receiving the preamble of the data strobe signal in response to a second write preamble command; resynchronizing the timing of the data strobe signal with the timing of the clock signal through the preamble of the data strobe signal; and processing third data, which is input in synchronization with the data strobe signal, under the control of the data strobe signal and the clock signal.

BRIEF DESCRIPTION OF THE DRAWINGS

Features, aspects, and embodiments are described in conjunction with the attached drawings, in which:

FIGS. 1A-1C are timing diagrams related to a known internal operation of a general semiconductor memory apparatus.

DETAILED DESCRIPTION

Figure 2A:
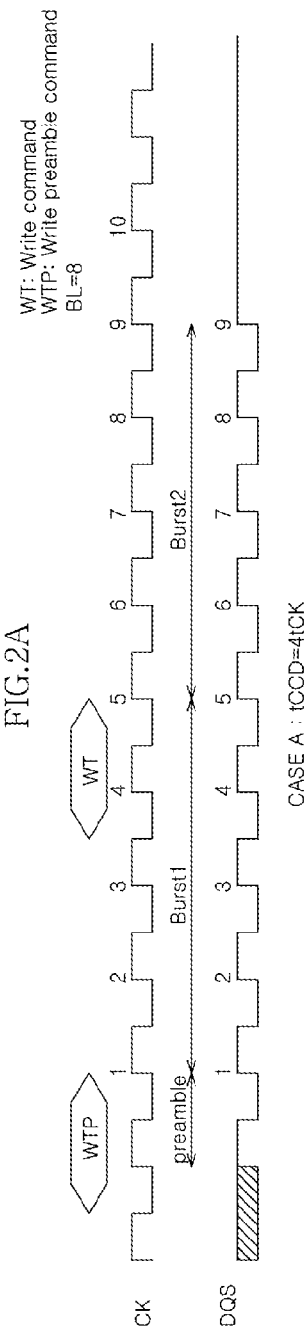
FIG. 2A-2C are timing diagrams related to an internal operation of a semiconductor memory apparatus according to an embodiment of the present invention.
Figure 2B:
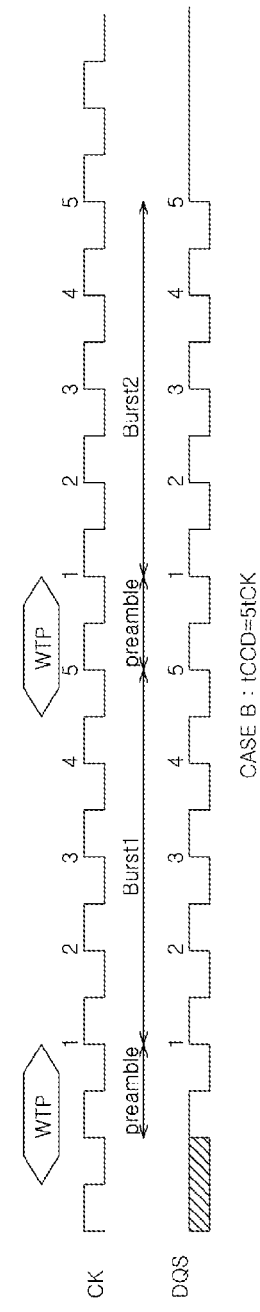
Figure 2C:
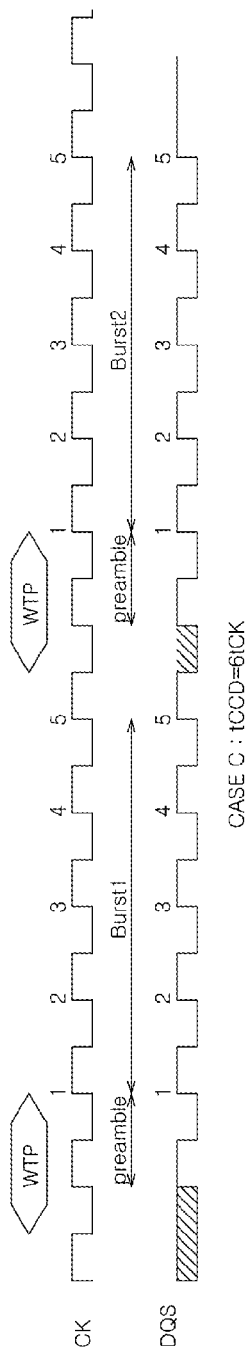

Hereinafter, a signal synchronization method and a data processing method according to exemplary embodiments of the is present invention will be described in detail with reference to the accompanying drawings FIG. 2A-2C are timing diagrams related to an internal operation of a semiconductor memory apparatus according to an embodiment of the present invention.

In the semiconductor memory apparatus according to an embodiment of the present invention, a preamble of a data strobe signal DQS is inputted in response to a write preamble command WTP. Consequently, no preamble detection circuit (which would have been needed to detecting position information of a preamble) is required, and it is therefore possible to recognize through the write preamble command WTP that a preamble has been inputted with no need for a preamble detection circuit. When the write preamble command WTP is inputted, data is inputted in synchronization with the data strobe signal DQS after the preamble of the data strobe signal DQS is inputted.

FIGS. 2A-2C are timing diagrams related to an operation when a 'tccd' (for example, an internal burst length) is a 4tck (CASE A), 5tck (CASE B), and 6tck (CASE C), respectively.

In the CASE A, when a preamble of a data strobe signal DQS is inputted in response to a write preamble command WTP, the timing of the data strobe signal DQS is synchronized with the timing of a clock signal through the preamble of the data strobe signal DQS. Data is then inputted in synchronization with the data strobe signal DQS. The data is inputted in synchronization with the data strobe signal DQS after the preamble is inputted, and the data is then processed by the clock signal CLK and data strobe signal DQS that are internally synchronized to each other and stored in an internal memory block.

In the CASE B and CASE C, when a preamble of a data strobe signal DQS is inputted in response to a first write preamble command WTP, timing of the data strobe signal DQS is synchronized with the timing of a clock signal CLK through the preamble of the data strobe signal DQS. After the preamble is inputted, data is inputted in synchronization with the data strobe signal DQS, and then the inputted data is processed by the clock signal CLK and data strobe signal DQS that are internally synchronized to each other and stored in the internal memory block. When the preamble of the data strobe signal DQS is inputted in response to a second write preamble command WTP, the timing of the clock signal CLK is resynchronized with the timing of the strobe signal DQS through the preamble of the data strobe signal DQS. After the preamble is inputted, data is inputted in synchronization with the data strobe signal DQS, and the inputted data is processed by the internally synchronized clock signal CLK and data strobe signal DQS and stored in the internal memory block.

That is, whenever a write preamble command WTP is inputted, a data processing operation is performed after having newly updated a synchronization operation between the clock signal CLK and the data strobe signal DQS. Furthermore, when the write command WT is inputted, only the data processing operation is performed under the control of the synchronized clock signal CLK and data strobe signal DQS.

As described above, the signal synchronization method includes, inter alia, a step of receiving a preamble of a data strobe signal in response to a write preamble command, and a step of synchronizing the data strobe signal with a clock signal through the preamble of the data strobe signal.

Furthermore, a method for processing data that is inputted in synchronization with a data strobe signal includes, inter alia, a step of receiving a preamble of the data strobe signal in response to a write preamble command, a step of synchronizing timing of the data strobe signal with timing of a clock signal through the preamble of the data strobe signal, and a step of processing data input in synchronization with the data strobe signal under the control of the data strobe signal and the clock signal.

Furthermore, a method for processing data that is inputted in synchronization with a data strobe signal includes, inter alia, a step of receiving a preamble of the data strobe signal in response to a first write preamble command, a step of synchronizing timing of the data strobe signal with timing of a clock signal through the preamble of the data strobe signal, a step of processing first data, which is inputted in synchronization with the data strobe signal, under the control of the data strobe signal and the clock signal, a step of processing second data, which is input in response to a first write command, under the control of the data strobe signal and the clock signal, a step of receiving the preamble of the data strobe signal in response to a second write preamble command, a step of resynchronizing the timing of the data strobe signal with the timing of the clock signal through the preamble of the data strobe signal, and a step of processing third data, which is input in synchronization with the data strobe signal, under the control of the data strobe signal and the clock signal.

While certain embodiments have been described above, it will be understood to those skilled in the art that the embodiments described are by way of example only. Accordingly, the signal synchronization method and the data processing method described herein should not be limited based on the described embodiments. Rather, the signal synchronization method and the data processing method described herein should only be limited in light of the claims that follow when taken in conjunction with the above description and accompanying drawings.

What is claimed is:

1. A method of synchronizing signals, comprising the steps of:
   updating a synchronization operation between a clock signal and a data strobe signal when a write preamble command is inputted,
   wherein the updating the synchronization operation comprises;
   receiving a preamble of the data strobe signal in response to the write preamble command, and
   synchronizing the data strobe signal with the clock signal through the preamble of the data strobe signal; and
   wherein the updating the synchronization operation is not performed when a write command is inputted.

2. The method of claim 1, wherein data is inputted in synchronization with the data strobe signal, which is synchronized with the clock signal, after the preamble is inputted for storage in an internal memory block.

3. A method of processing data that is inputted in synchronization with a data strobe signal, comprising the steps of:
   performing a data processing operation after having newly updated a synchronization operation between a clock signal and the data strobe signal when a write preamble command is inputted,
   wherein the performing the data processing operation comprises;
   receiving a preamble of the data strobe signal in response to the write preamble command;
   synchronizing timing of the data strobe signal with timing of the clock signal through the preamble of the data strobe signal; and
   processing data, which is input in synchronization with the data strobe signal, under a control of the data strobe signal and the clock signal, wherein the synchronization operation is not newly updated and the performing the data processing operation is only performed when a write command is inputted.

4. The method of claim 3, wherein data is inputted in synchronization with the data strobe signal, which is synchronized with the clock signal, after the preamble is inputted for storage in an internal memory block.

5. A method of processing data that is inputted in synchronization with a data strobe signal, comprising the steps of:
- receiving a preamble of the data strobe signal in response to a first write preamble command;
- synchronizing timing of the data strobe signal with timing of a clock signal through the preamble of the data strobe signal;
- processing first data, which is inputted in synchronization with the data strobe signal, under a control of the data strobe signal and the clock signal;
- processing second data, which is inputted in response to a first write command, under the control of the data strobe signal and the clock signal;
- receiving the preamble of the data strobe signal in response to a second write preamble command;
- resynchronizing the timing of the data strobe signal with the timing of the clock signal through the preamble of the data strobe signal; and
- processing third data, which is input in synchronization with the data strobe signal, under the control of the data strobe signal and the clock signal.

* * * * *